United States Patent
Hacke et al.

(10) Patent No.: US 7,863,084 B2
(45) Date of Patent: Jan. 4, 2011

(54) CONTACT FABRICATION OF EMITTER WRAP-THROUGH BACK CONTACT SILICON SOLAR CELLS

(75) Inventors: Peter Hacke, Albuquerque, NM (US); James M. Gee, Albuquerque, NM (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 12/553,803

(22) Filed: Sep. 3, 2009

(65) Prior Publication Data
US 2009/0320922 A1 Dec. 31, 2009

Related U.S. Application Data

(62) Division of application No. 11/050,184, filed on Feb. 3, 2005, now abandoned.

(60) Provisional application No. 60/542,390, filed on Feb. 5, 2004, provisional application No. 60/542,454, filed on Feb. 5, 2004.

(51) Int. Cl.
*H01L 21/38* (2006.01)
(52) U.S. Cl. .................. 438/98; 438/558; 257/E31.093
(58) Field of Classification Search ................. 438/548
See application file for complete search history.

(56) References Cited

U.S. PATENT DOCUMENTS

| | | | |
|---|---|---|---|
| 2,770,761 A | 11/1956 | Pfann | |
| 2,813,048 A | 11/1957 | Pfann | |
| 3,903,427 A | 9/1975 | Pack | |
| 3,903,428 A | 9/1975 | DeJong | |
| 3,936,319 A | 2/1976 | Anthony et al. | |
| 4,032,960 A | 6/1977 | Anthony et al. | |
| 4,056,879 A | 11/1977 | Lindmayer | |
| 4,065,742 A | 12/1977 | Kendall et al. | |
| 4,152,824 A | 5/1979 | Gonsiorawski | |
| 4,165,558 A | 8/1979 | Armitage et al. | |
| 4,173,496 A | 11/1979 | Chiang et al. | |
| 4,184,897 A | 1/1980 | Anthony et al. | |

(Continued)

FOREIGN PATENT DOCUMENTS

EP 0452588 A1 10/1991

(Continued)

OTHER PUBLICATIONS

Book, Felix et al., "Two Diffusion Step Selective Emitter: Comparison of Mask Opening by Laser or Etching Paste", *23rd European Photovoltaic Solar Energy Conference and Exhibition*, Valencia, Spain, Sep. 5, 2008 Sep. 5, 2008.

(Continued)

*Primary Examiner*—Stephen W Smoot
(74) *Attorney, Agent, or Firm*—Patterson & Sheridan, LLP.

(57) ABSTRACT

Back contact solar cells including rear surface structures and methods for making same. The rear surface has small contact areas through at least one dielectric layer, including but not limited to a passivation layer, a nitride layer, a diffusion barrier, and/or a metallization barrier. The dielectric layer is preferably screen printed. Large grid areas overlay the dielectric layer. The methods provide for increasing efficiency by minimizing p-type contact areas and maximizing n-type doped regions on the rear surface of a p-type substrate.

8 Claims, 9 Drawing Sheets

U.S. PATENT DOCUMENTS

| | | | |
|---|---|---|---|
| 4,190,852 A | 2/1980 | Warner, Jr. | |
| 4,227,942 A | 10/1980 | Hall | |
| 4,234,352 A | 11/1980 | Swanson | |
| 4,297,391 A | 10/1981 | Lindmayer | |
| 4,427,839 A | 1/1984 | Hall | |
| 4,478,879 A | 10/1984 | Baraona et al. | |
| 4,536,607 A | 8/1985 | Wiesmann | |
| 4,595,790 A | 6/1986 | Basol | |
| 4,626,613 A | 12/1986 | Wenham et al. | |
| 4,663,828 A | 5/1987 | Hanak | |
| 4,663,829 A | 5/1987 | Hartman et al. | |
| 4,667,058 A | 5/1987 | Catalano et al. | |
| 4,667,060 A | 5/1987 | Spitzer | |
| 4,726,850 A | 2/1988 | Wenham et al. | |
| 4,748,130 A | 5/1988 | Wenham et al. | |
| 4,751,191 A | 6/1988 | Gonsiorawski et al. | |
| 4,838,952 A | 6/1989 | Dill et al. | |
| 4,927,770 A | 5/1990 | Swanson | |
| 5,011,565 A | 4/1991 | Dube et al. | |
| 5,011,782 A | 4/1991 | Lamb et al. | |
| 5,053,083 A | 10/1991 | Sinton | |
| 5,053,355 A | 10/1991 | von Campe | |
| 5,067,985 A | 11/1991 | Carver et al. | |
| 5,103,268 A | 4/1992 | Yin et al. | |
| 5,118,362 A | 6/1992 | St. Angelo et al. | |
| 5,178,685 A | 1/1993 | Borenstein et al. | |
| 5,258,077 A | 11/1993 | Shahryar | |
| 5,266,126 A | 11/1993 | Deguchi | |
| 5,273,934 A | 12/1993 | Ehinger et al. | |
| 5,357,131 A | 10/1994 | Sunami et al. | |
| 5,425,816 A | 6/1995 | Cavicchi et al. | |
| 5,468,652 A | 11/1995 | Gee | |
| 5,494,832 A | 2/1996 | Lehmann et al. | |
| 5,547,516 A | 8/1996 | Luch | |
| 5,585,165 A | 12/1996 | Kennedy et al. | |
| 5,593,901 A | 1/1997 | Oswald et al. | |
| 5,595,607 A | 1/1997 | Wenham et al. | |
| 5,641,362 A | 6/1997 | Meier | |
| 5,646,397 A | 7/1997 | Wenham et al. | |
| 5,797,998 A | 8/1998 | Wenham et al. | |
| 5,851,912 A | 12/1998 | Liaw et al. | |
| 5,871,591 A | 2/1999 | Ruby et al. | |
| 5,899,704 A | 5/1999 | Schlosser et al. | |
| 5,928,438 A | 7/1999 | Salami et al. | |
| 5,942,050 A | 8/1999 | Green et al. | |
| 5,951,786 A | 9/1999 | Gee et al. | |
| 5,972,732 A | 10/1999 | Gee et al. | |
| 5,981,868 A | 11/1999 | Kushiya et al. | |
| 5,990,415 A | 11/1999 | Green et al. | |
| 6,048,442 A | 4/2000 | Kushiya et al. | |
| 6,069,313 A | 5/2000 | Kay | |
| 6,077,722 A | 6/2000 | Jansen et al. | |
| 6,081,017 A | 6/2000 | Kim et al. | |
| 6,091,021 A | 7/2000 | Ruby et al. | |
| 6,092,669 A | 7/2000 | Kushiya et al. | |
| 6,130,380 A | 10/2000 | Nakamura | |
| 6,143,976 A | 11/2000 | Endroes | |
| 6,162,658 A | 12/2000 | Green et al. | |
| 6,175,141 B1 | 1/2001 | Hofbauer et al. | |
| 6,180,869 B1 | 1/2001 | Meier et al. | |
| 6,184,056 B1 | 2/2001 | Nakamura et al. | |
| 6,184,057 B1 | 2/2001 | Van Andel et al. | |
| 6,210,991 B1 | 4/2001 | Wenham et al. | |
| 6,262,359 B1 | 7/2001 | Meier et al. | |
| 6,300,557 B1 | 10/2001 | Wanlass | |
| 6,384,316 B1 | 5/2002 | Shinohara et al. | |
| 6,384,317 B1 | 5/2002 | Kerschaver et al. | |
| 6,410,362 B1 | 6/2002 | Simburger et al. | |
| 6,420,647 B1 | 7/2002 | Ji et al. | |
| 6,429,037 B1 | 8/2002 | Wenham et al. | |
| 6,441,297 B1 | 8/2002 | Keller et al. | |
| 6,538,195 B1 | 3/2003 | Shi et al. | |
| 6,559,479 B1 | 5/2003 | Luedemann | |
| 6,559,497 B2 | 5/2003 | Shih et al. | |
| 6,573,445 B1 | 6/2003 | Burgers | |
| 6,613,653 B2 | 9/2003 | Naseem et al. | |
| 6,632,730 B1 | 10/2003 | Meier et al. | |
| 6,660,930 B1 | 12/2003 | Gonsiorawski | |
| 6,664,631 B2 | 12/2003 | Meier et al. | |
| 6,703,295 B2 | 3/2004 | Meier et al. | |
| 6,734,037 B1 | 5/2004 | Fath et al. | |
| 6,737,340 B2 | 5/2004 | Meier et al. | |
| 6,777,729 B1 | 8/2004 | Prince et al. | |
| 6,846,984 B2 | 1/2005 | Fath et al. | |
| 6,927,417 B2 | 8/2005 | Nagashima et al. | |
| 7,053,294 B2 | 5/2006 | Tuttle et al. | |
| 7,170,001 B2 | 1/2007 | Gee et al. | |
| 2002/0011641 A1 | 1/2002 | Oswald et al. | |
| 2002/0117199 A1 | 8/2002 | Oswald | |
| 2002/0119592 A1 | 8/2002 | Oswald et al. | |
| 2003/0003693 A1 | 1/2003 | Meier et al. | |
| 2003/0008485 A1 | 1/2003 | Meier et al. | |
| 2003/0037815 A1 | 2/2003 | Kim et al. | |
| 2003/0044539 A1 | 3/2003 | Oswald | |
| 2003/0089393 A1 | 5/2003 | Fath et al. | |
| 2003/0102022 A1 | 6/2003 | Fath et al. | |
| 2003/0116185 A1 | 6/2003 | Oswald et al. | |
| 2003/0143827 A1 | 7/2003 | Wenham et al. | |
| 2003/0180983 A1 | 9/2003 | Oswald et al. | |
| 2003/0203603 A1 | 10/2003 | Meier et al. | |
| 2004/0187916 A1 | 9/2004 | Hezel | |
| 2004/0200520 A1 | 10/2004 | Mulligan et al. | |
| 2004/0219801 A1 | 11/2004 | Oswald et al. | |
| 2004/0261839 A1 | 12/2004 | Gee et al. | |
| 2004/0261840 A1 | 12/2004 | Schmit et al. | |
| 2005/0115604 A1 | 6/2005 | Fath et al. | |
| 2005/0172996 A1 | 8/2005 | Hacke et al. | |
| 2005/0176164 A1 | 8/2005 | Gee et al. | |
| 2006/0162766 A1 | 7/2006 | Gee et al. | |
| 2006/0266081 A1 | 11/2006 | M'Saad et al. | |
| 2008/0023061 A1 | 1/2008 | Clemens et al. | |

FOREIGN PATENT DOCUMENTS

| | | |
|---|---|---|
| JP | 60000783 | 1/1985 |
| JP | 02051282 A | 2/1990 |
| WO | WO89/04062 | 5/1989 |
| WO | WO 93/24960 | 12/1993 |
| WO | WO 02/25743 A2 | 3/2002 |
| WO | WO 2004/100244 A1 | 11/2004 |

OTHER PUBLICATIONS

Brucker, Charles, "Magneto-Optical Thin Film Recording Materials in Practice", *Handbook of Magneto-Optical Data Recording*, McDaniel et al., ed. Noyes Publications, Westwood, New Jersey 1997, 279-361.

Cline, H. E. et al., "Thermomigration of aluminum-rich liquid wires through silicon", *J. Appl. Phys.* vol. 47, No. 6 Jun. 1978, 2332-2336.

Dicker, J. et al., "Analysis of rear contacted solar cell structures for cost effective processes and materials", *Photovoltaic Specialists Conference, 2000, Conference Record of the Twenty-Eighth IEEE* Anchorage, Alaska Sep. 15-22, 2000, 387-390.

Duerinckx, F. et al., "Improved Screen Printing Process for Very Thin Multicrystalline Silicon Solar Cells", *presented at the 19th EPVSEC, Paris* 2004.

Eikelboom, D.W.K. et al., "Conductive Adhesives for Interconnection of Busbarless Emitter Wrap-Through Solar Cells on a Structured Metal Foil", *presented at the 17th European Photovoltaic Solar Energy Conference*, Munich, Germany, Oct. 22-26, 2001 Oct. 2001.

Gee, James M. et al., "Back-Contact Crystalline-Silicon Solar Cells and Modules", *NCPV Program Review Meeting* Sep. 8-11, 1998, 1-6.

Gee, J. M. et al., "Emitter wrap-through solar cell", *Photovoltaic Specialists Conference 1993, Conference Record of the Twenty Third IEEE* Louisville, Kentucky May 10-14, 1993, 265-270.

Gee, James M. et al., "Progress on the Emitter Wrap-Through Silicon Solar Cell", *12th European Photovoltaic Solar Energy Conference* Amsterdam Apr. 1994.

Gee, James M. et al., "Simplified Module Assembly Using Back-Contact Cyrstalline-Silicon Solar Cells", *26th PVSC* Anaheim, California 1977, 1085-1088.

Gee, James M. et al., "Towards a Manufacturable Back-Contact Emitter-Wrap-Through Silicon Solar Cell", *31st IEEE Photovoltaic Specialists Conference* Orlando, Florida Jan. 2005, 3-7.

Hacke, Peter et al., "Application of Boron Source Diffusion Barrier for the Fabrication of Back Cotnact Silicon Solar Cells", *31st IEEE Photovoltaic Specialists Conference* Orlando, Florida Jan. 2005, 3-7.

Hacke, P. et al., "Efficiency Optimization of the n+/n/p+ "PHOSTOP" Cell", *19th European Photovoltaic Solar Energy Conference* Paris, France Jun. 7, 2004, 1292-1295.

Hacke, Peter et al., "Poster for "Application of a Boron Source Diffusion Barrier for the Fabrication of Back Contact Silicon Solar Cells"", *31st IEEE Photovoltaic Specialist Conference* Orlando, Florida Jan. 2005, 3-7.

Haverkamp, Helge et al., "Minimizing the Electrical Losses on the Front Side: Development of a Selective Emitter Process from a Single Diffusion", *33rd IEEE Photovoltaic Specialists Conference*, San Diego, CA. May 15, 2008.

Hilali, M. et al., "Optimization of Self-Doping Ag Paste Firing to Achieve High Fill Factors on Screen-Printed Silicon Solar Cells with a 100 ohm/sq. Emitter", *29th IEEE Photovoltaic Specialists Conference* New Orleans, Louisiana May 2002, 356-359.

Jooss, W. et al., "Large Area Multicrystalline Silicon Buried Contact Solar Cells with Bulk Passivation", May 2002.

Knauss, H. et al., "Emitter Wrap Through Solar Cells Using Electroless Plating Metallisation", 2001.

Meier, D.L. et al., "Self-Doping Contacts to Silicon Using Silver Coated with a Dopant Source", *28th IEEE Photovoltaic Specialists Conference* 2000, 69-74.

Neu, W. et al., "Low-cost multicrystalline back-contact silicon solar cells with screen printed metallization", *Elsevier Solar Energy Materials & Solar Cells* 2002, 139-146.

Pernau, Thomas et al., "Summary of the BMWI-UKN Project on Innovative and Cost-Effective Crystalloine Silicon Solar Cells with New Applications", Sep. 2005.

Peter, K. et al., "Future Potential for SOG-SI Feedstock from the Metallurgical Process Route", *23rd EU-PVSEC* Valencia, Spain, Sep. 1-5, 2008 Sep. 1, 2008.

Pritchard, Stephen C., "A Comparison of Single Junction and Transistor Structure Solar Cells", *Proceedings of Solar '97, Paper 112* Australian and New Zealand Solar Energy Society 1997.

Schneider, A. et al., "AL BSF for Thin Screenprinted Multicrystalline SI Solar Cells", *presented at the 17th Eur. PV Solar Energy Conf.*, Munich Oct. 2001.

Schneider, A. et al., "Bow Reducing Factors for Thin Screenprinted MC-SI Solar Cells with AL BSF", *presented at the 29th IEEE Photovolatic Specialists Conference*, New Orleans, LA 336.

Schoenecker, A. et al., "Ace Designs: The Beauty of Rear Contact Solar Cells", *Presented at the 29th IEEE Photovoltaic Specialists Conference*, May 20-24, 2002, New Orleand, USA May 2002.

Schoenecker, A. et al., "Advanced Crystalline Silicon Solar Cell Designs (ACE)", *Final Report of European Commission project* JOR3-CT98-0269.

Schoenecker, A. et al., "An Industrial Multi-Crystalline EWT Solar Cell with Screen Printed Metallisation", *14th Eur. Photovoltaic Solar Energy Conference and Exhibition* Barcelona, Spain 1997.

Smith, David D. et al., "Circuit Modeling of the Emitter-Wrap-Through Solar Cell", *IEEE Transactions on Electron Devices* vol. 46, No. 10 Oct. 1999.

Smith, D., "Emitter-Wrap Through Solar Cells With Screen-Printed Contacts", *NCPV Program Review Meeting 2000* NREL Report No. BK-520-28064 Apr. 16-19, 2000, 307.

Smith, David D. et al., "Review of Back Contact Silicon Solar Cells for Low Cost Application", *16th Eur. Photovoltaic Solar Energy Conference and Exhibition* Glasgow, United Kingdom 1999.

Tool, C.J.J. et al., "Effect of Wafer Thickness on the Performance of mc-Si Solar Cells", *presented at the 17th European Photovoltaic Solar Energy Conference*, Munich 2001.

Verlinden, P. et al., "Multilevel Metallization for Large Area Point-Contact Solar Cells", *IEEE* 1988, 532-537.

European Office Action dated May 26, 2010 for European Patent Application No. 05712953.8.

CONTACT FABRICATION OF EMITTER WRAP-THROUGH BACK CONTACT SILICON SOLAR CELLS

CROSS-REFERENCE TO RELATED APPLICATIONS

This application is a divisional application of U.S. patent application Ser. No. 11/050,184, now abandoned, entitled "Contact Fabrication of Emitter Wrap-Through Back Contact Silicon Solar Cells", filed on Feb. 3, 2005, which application claims the benefit of the filing of U.S. Provisional Patent Application Ser. No. 60/542,390, entitled "Fabrication of Back-Contact Silicon Solar Cells", filed on Feb. 5, 2004, and of U.S. Provisional Patent Application Ser. No. 60/542,454, entitled "Process for Fabrication of Buried-Contact Cells Using Self-Doping Contacts", filed on Feb. 5, 2004. This application is related to U.S. Utility patent application Ser. No. 11/050,185, entitled "Back-Contact Solar Cells and Methods for Fabrication", filed on Feb. 3, 2005, now U.S. Pat. No. 7,144,751, and U.S. Utility patent application Ser. No. 11/050,182, entitle-Id entitled "Buried-Contact Solar Cells With Self-Doping Contacts", filed Feb. 3, 2005, now U.S. Pat. No. 7,335,555. The specifications and claims of all said applications are incorporated herein by reference.

BACKGROUND OF THE INVENTION

1. Field of the Invention (Technical Field)

The present invention relates to methods and processes for making the back-contact structure in a back-contact silicon solar cell and solar cells made by such methods.

2. Background Art

Note that the following discussion refers to a number of publications and references. Discussion of such publications herein is given for more complete background of the scientific principles and is not to be construed as an admission that such publications are prior art for patentability determination purposes.

The solar cell design in widespread use today has a p/n junction formed near the front surface (that surface which receives the light) which creates an electron flow as light energy is absorbed in the cell. The conventional cell design has one set of electrical contacts on the front side of the cell, and a second set of electrical contacts on the back side of the solar cell. In a typical photovoltaic module these individual solar cells are interconnected electrically in series to increase the voltage. This interconnection is typically accomplished by soldering a conductive ribbon from the front side of one solar cell to the back side of an adjacent solar cell.

Back-contact silicon solar cells have several advantages compared to conventional silicon solar cells. The first advantage is that back-contact cells have a higher conversion efficiency due to reduced or eliminated contact obscuration losses (sunlight reflected from contact grid is unavailable to be converted into electricity). The second advantage is that assembly of back-contact cells into electrical circuits is easier, and therefore cheaper, because both conductivity type contacts are on the same surface. As an example, significant cost savings compared to present photovoltaic module assembly can be achieved with back-contact cells by encapsulating the photovoltaic module and the solar cell electrical circuit in a single step. The last advantage of a back-contact cell is better aesthetics through a more uniform appearance. Aesthetics is important for some applications, such as building-integrated photovoltaic systems and photovoltaic sunroofs for automobiles.

FIG. 1 illustrates a generic back-contact cell structure. The silicon substrate may be n-type or p-type. One of the heavily doped emitters ($n^{++}$ or $p^{++}$) may be omitted in some designs. Alternatively, the heavily doped emitters could directly contact each other on the rear surface in other designs. Rear-surface passivation helps reduce loss of photogenerated carriers at the rear surface, and helps reduce electrical losses due to shunt currents at undoped surfaces between the contacts.

There are several approaches for making a back-contact silicon solar cell. These approaches include metallization wrap around (MWA), metallization wrap through (MWT), emitter wrap through (EWT), and back-junction structures. MWA and MWT have metal current collection grids on the front surface. These grids are, respectively, wrapped around the edge or through holes to the back surface in order to make a back-contact cell. The unique feature of EWT cells, in comparison to MWT and MWA cells, is that there is no metal coverage on the front side of the cell, which means that none of the light impinging on the cell is blocked, resulting in higher efficiencies. The EWT cell wraps the current-collection junction ("emitter") from the front surface to the rear surface through doped conductive channels in the silicon wafer. "Emitter" refers to a heavily doped region in a semiconductor device. Such conductive channels can be produced by, for example, drilling holes in the silicon substrate with a laser and subsequently forming the emitter inside the holes at the same time as forming the emitter on front and rear surfaces. Back-junction cells have both the negative and positive polarity collection junctions on the rear surface of the solar cell. Because most of the light is absorbed—and therefore also most of the carriers are photogenerated—near the front surface, back-junction cells require very high material quality so that carriers have sufficient time to diffuse from the front to the rear surface with the collection junctions on the rear surface. In comparison, the EWT cell maintains a current collection junction on the front surface, which is advantageous for high current collection efficiency. The EWT cell is disclosed in U.S. Pat. No. 5,468,652, *Method Of Making A Back Contacted Solar Cell*, to James M. Gee, incorporated here in full. The various other back contact cell designs have also been discussed in numerous technical publications.

In addition to U.S. Pat. No. 5,468,652, two other U.S. patents on which Gee is a co-inventor disclose methods of module assembly and lamination using back-contact solar cells, U.S. Pat. No. 5,951,786, *Laminated Photvoltaic Modules Using Back-Contact Solar Cells*, and U.S. Pat. No. 5,972,732, *Method of Monolithic Module Assembly*. Both patents disclose methods and aspects that may be employed with the invention disclosed herein, and are incorporated by reference as if set forth in full. U.S. Pat. No. 6,384,316, *Solar Cell and Process of Manufacturing the Same*, discloses an alternative back-contact cell design, but employing MWT, wherein the holes or vias are spaced comparatively far apart, with metal contacts on the front surface to help conduct current to the rear surface, and further in which the holes are lined with metal.

A critical issue for any back-contact silicon solar cell is developing a low-cost process sequence that also electrically isolates the negative and positive polarity grids and junctions. The technical issue includes patterning of the doped layers (if present), passivation of the surface between the negative and positive contact regions, and application of the negative and positive polarity contacts.

BRIEF SUMMARY OF THE INVENTION

The present invention is a method for making a back-contact solar cell, the method comprising the steps of forming a plurality of holes extending from a front surface of a semiconductor substrate to a rear surface of the substrate, the substrate comprising a first conductivity type; providing a diffusion comprising an opposite conductivity type on the front surface, the rear surface, and on surfaces enclosing the holes; depositing a patterned dielectric layer on the rear surface; alloying a plurality of contacts comprising the first conductivity type with the substrate; disposing a first conductive grid on the dielectric layer in electrical contact with the contacts; and disposing a second conductive grid on the rear surface in electrical contact with the diffusion. The alloying step may be performed through existing regions of the dielectric layer or after removing regions of the dielectric layer to expose regions of the rear surface. The diffusion is preferably lightly doped.

In this method the contacts preferably occupy less than 30%, more preferably less than 20%, and most preferably less than 10% of the area of the rear surface. Substantially all portions of the rear surface not occupied by the contacts preferably comprise the diffusion. The contacts preferably comprise aluminum. Material comprising the second conductive grid preferably at least partially fills the holes. A width of a grid line of the first conductive grid is preferably wider than a width of the contact. The first conductive grid is preferably interdigitated with the second conductive grid. At least one of the conductive grids preferably comprises grid lines having a tapered width.

The present invention is also a method of making a back-contact solar cell, the method comprising the steps of: forming a plurality of holes extending from a front surface of a semiconductor substrate to a rear surface of the substrate, the substrate comprising a first conductivity type; depositing a patterned diffusion barrier on the rear surface; providing a diffusion comprising an opposite conductivity type on the front surface, regions of the rear surface not covered by the diffusion barrier, and on surfaces enclosing the holes; disposing a first conductive grid on the diffusion barrier in electrical contact with the substrate in a subset of the regions; and disposing a second conductive grid on the rear surface in electrical contact with the diffusion. The method preferably further comprises the step of changing the conductivity type of the subset of the regions substantially to the first conductivity type. The depositing step preferably comprises using screen printing. Material comprising the second conductive grid preferably at least partially fills the holes. The width of a grid line of the first conductive grid is preferably wider than a width of on of the regions. The second conductive grid preferably partially overlaps the diffusion barrier and is preferably interdigitated with the first conductive grid. At least one of the conductive grids preferably comprises grid lines having a tapered width.

The invention is further a method of making a back-contact solar cell, the method comprising the steps of: forming a plurality of holes extending from a front surface of a semiconductor substrate to a rear surface of the substrate, the substrate comprising a first conductivity type; depositing a patterned diffusion barrier on the rear surface; providing a diffusion comprising an opposite conductivity type on the front surface, first regions of the rear surface not covered by the diffusion barrier, and on surfaces enclosing the holes; removing the diffusion barrier; depositing a metallization barrier on the rear surface, the metallization barrier comprising: first openings smaller than the first regions and aligned with the holes; and second openings aligned with and smaller than second regions of the rear surface that had been covered by the diffusion barrier; disposing a first conductive grid partially on the metallization barrier and in electrical contact with the diffusion through the first openings; and disposing a second conductive grid partially on the metallization barrier and in electrical contact with the substrate through the second openings.

In this method the metallization barrier preferably provides passivation to the rear surface and preferably comprises a transition metal oxide. The depositing steps preferably comprise using screen printing. The second conductive grid preferably comprises aluminum. Material comprising the first conductive grid preferably at least partially fills the holes. The width of a grid line of the first conductive grid is preferably wider than the width of a first opening. The width of a grid line of the second conductive grid is preferably wider than the width of a second opening. The second openings preferably occupy less than 30%, more preferably less than 20%, and most preferably less than 10% of the area of the rear surface. A majority of the rear surface not occupied by the second openings preferably comprises the diffusion. The first conductive grid is preferably interdigitated with the second conductive grid. At least one of the conductive grids preferably comprises grid lines having a tapered width.

The invention is also a back-contact solar cell made according to the foregoing methods.

The invention is further a back-contact solar cell comprising a substrate comprising a first conductivity type; a diffusion comprising an opposite conductivity type on portions of a rear surface of the substrate; a screen printed dielectric layer on the rear surface; a plurality of openings in the dielectric layer, wherein regions of the rear surface exposed through the openings comprise the first conductivity type; a plurality of conductive contacts disposed in the openings; and a plurality of gridlines electrically connected to the contacts, the gridlines comprising a width greater than a width of the openings. The dielectric layer is preferably selected from the group consisting of passivation layer, nitride layer, diffusion barrier, and metallization barrier. The contacts preferably comprise aluminum. The openings preferably comprise less than 30%, more preferably less than 20%, and most preferably less than 10% of the surface area of the rear surface. The majority of the rear surface not exposed through the openings preferably comprises the diffusion. The substrate preferably comprises holes extending from a front surface of the substrate to the rear surface, which holes are preferably at least partially filled with material comprising a metallization in contact with the diffusion.

An object of the present invention is to provide a rear surface contact structure for back-contact solar cells comprising wide grid lines for increased conduction combined with a minimum of p-type contact areas and a maximum of n-type diffusion for increased efficiency.

An advantage of the present invention is that it provides for manufacturing processes with fewer, more economical process steps that produce high efficiency solar cells.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

The invention disclosed herein provides for improved methods and processes for fabrication of back-contact solar cells, particularly methods and processes providing for more economical fabrication and more efficient configurations of rear surface contacts and grids. It is to be understood that while a number of different discrete methods are disclosed, one of skill in the art could combine or vary two or more methods, thereby providing an alternative additional method of fabrication. It is also to be understood that while the figures and example process sequences describe fabrication of back-contact emitter-wrap-through cells, these process sequences can be used for fabrication of other back-contact cell structures such as MWT, MWA, or back-junction solar cells.

Process Using Aluminum-Alloyed Junctions for Making Contact to a P-Type Base in a Back-Contact Solar Cell The process described in this section may be employed to eliminate the need for patterning of the $n^+$ diffusion on the rear surface of the cell, thus providing a higher conversion efficiency. Typically, the region with the exposed p-type surface on the rear ($n^+p$ structure) has a lower energy conversion efficiency than the region with the $n^+$ diffusion on the rear surface ($n^+pn^+$ structure). The region with the $n^+pn^+$ structure has a higher conversion efficiency because photogenerated carriers can be collected at the $n^+$ junction on either surface. Thus it is advantageous to minimize the p-type surface area on the rear of the cell. In addition, because the p-type surface must be well passivated in order to achieve maximum efficiency, the passivation layers on the p-type surface must be of high quality and relatively free of defects, which is difficult and expensive to achieve. By minimizing this area, the need for any passivation at all is greatly reduced, or even eliminated. This results in cost savings due to a reduction in process steps. Note that the choice of a p-type base is arbitrary; the present method is applicable if a wafer of either conductivity type is used.

Figure 2:
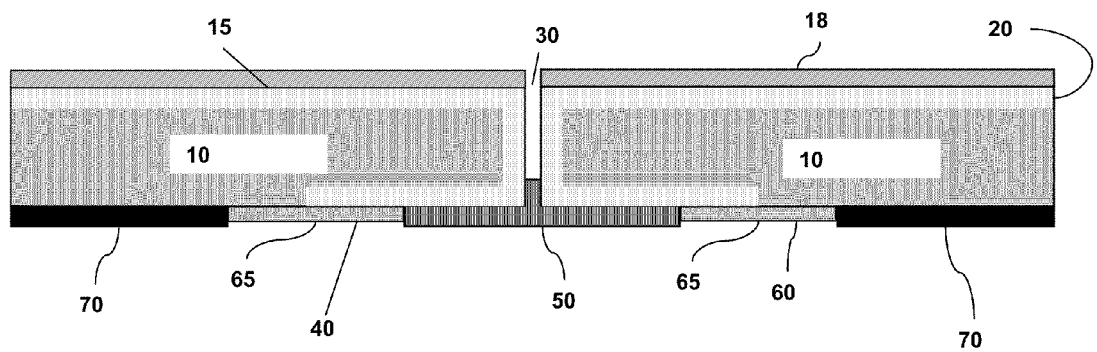
FIG. 2 is a cross-section illustration of a standard EWT cell, with a side view through a hole ("via") and perpendicular to the grid lines.

Screen printing to pattern the $n^+$ diffusion can be used. FIG. 2 shows a typical EWT cell with screen printed diffusions on the rear side. P-type silicon wafer 10 preferably comprises $n^+$ diffusion 20 on substantially the entire front cell surface 15 and the walls of hole 30. Dielectric layer 18, preferably comprising a nitride including but not limited to silicon nitride, is preferably disposed on front cell surface 15 in order to passivate the surface and provide an anti-reflection coating. The $n^+$ diffusion surrounding the via on the rear surface forms high efficiency $n^+pn^+$ region 40, adjacent to which n-type contact and grid 50 is disposed. The remainder of the rear surface forms $n^+p$ region (p-type surface) 60. P-type contact and grid 70 is disposed adjacent to p-type surface 60. Thin dielectric layer 65 is optionally disposed on the rear surface between n-type grid 50 and p-type grid 70. As shown schematically in FIG. 2, the problem with using screen printing is that only relatively coarse geometries are possible due to alignment tolerances, so that roughly 30 to 50% of the back surface ends up as p-type surface.

Figure 3:
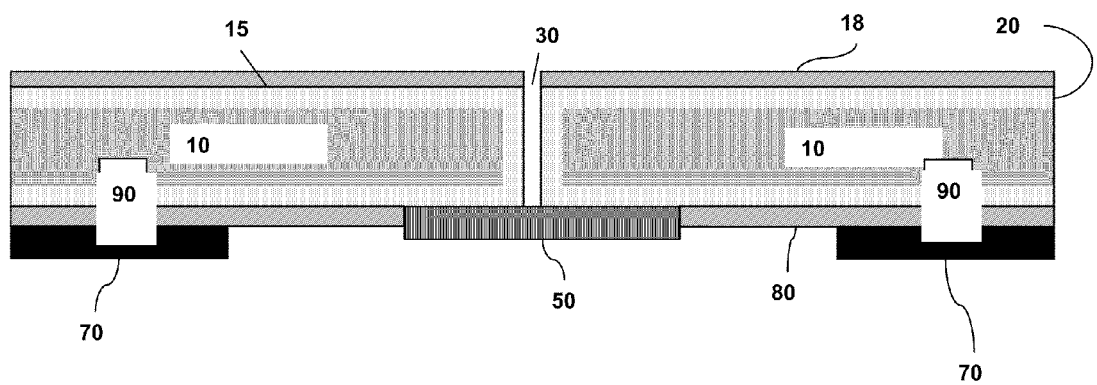
FIG. 3 is a cross-section illustration of an EWT cell of the invention with aluminum-alloyed contacts to the p-type substrate. It is a side view through a hole ("via") and perpendicular to the grid lines.

As shown in FIG. 3, an EWT cell with an Al-alloyed contact manufactured according to the present invention has a higher conversion efficiency than the cell shown in FIG. 2 because most of the rear surface is covered with high-efficiency $n^+$ diffusion 20. The aluminum alloy forms heavily doped p-type contact 90 that compensates the $n^+$ diffusion to allow contact with the p-type silicon base. The aluminum or aluminum alloy preferably reacts with silicon above the eutectic temperature. Printed p-type contact and grid 70, preferably comprising silver, covers the Al-alloyed contact to carry current to the cell edges. Grid 70 must in this case be electrically isolated from the $n^+$ diffusion. This is preferably accomplished by the use of dielectric passivation layer 80, preferably comprising a nitride, including but not limited to SiN. P-type contacts 90 can be made small enough so that most of the cell now had the high-efficiency $n^+pn^+$ structure. The percentage of the total rear surface area occupied by p-type contacts 90 is preferably less than 30%, more preferably less than 20%, and most preferably less than 10%.

Although use of pure aluminum or an alloy comprising aluminum is preferred, various other alloys or pure metals, including but not limited to any self-doping p-type metallizations, may alternatively be used. The aluminum is optionally doped with one or more other p-type dopants, including but not limited to boron, providing a more heavily doped junction. The contact material is preferably able to compensate the n+ diffusion in order to make electrical contact to the p-type base. This preferably requires a relatively light n+ diffusion (>80 ohms/sq) on the rear surface to prevent shunt currents at the n+ to p+ (Al-alloyed Si) junction. However, light n+ diffusions are more difficult to contact. A self-doping Ag-paste contact—which contains phosphorus dopant and is designed to be fired at temperatures above the silver-silicon eutectic temperature—may optionally be used to contact the lightly doped n+ diffusion. Self-doping contacts are described more fully in U.S. Utility Patent Application 11/050182, entitled "Buried-Contact Solar Cells With Self-Doping Contacts", by James M. Gee and Peter Hacke. The self-doping contact produces a doped junction beneath the contact, which helps lower contact resistance and reduces recombination losses. A more lightly doped n+ diffusion on the front surface also has the advantage of reduced carrier losses. In the specific case of the EWT cell, the n-type species additionally functions to facilitate conduction of electronic carriers in the holes or vias. Alternatively, some of the process sequences described in U.S. Utility Patent Application 11/050785, entitled "Back-Contact Solar Cells and Methods for Fabrication", by James M. Gee and Peter Hacke, can be employed to form regions of highly and lightly phosphorus doped silicon on the rear surface, with the heavily doped n++ regions occurring where the n-type contacts will be placed and lightly doped n+ regions occurring where the Al-alloyed contact will be placed.

The aluminum alloy is preferably able to alloy through the dielectric layer on the rear surface. Aluminum is known to be able to alloy through various oxides. Frit can be added to the Al paste to facilitate punching through the dielectric layer. Alternatively, the dielectric can be removed in areas for the aluminum-alloyed contact if the Al has difficulty alloying through the dielectric layer. For example, a laser can be used to punch small holes (preferably <50 µm diameter) in the dielectric to expose the silicon surface. Other methods for removing the dielectric layers, such as mechanical scribing or an etch process (typically comprising screen printing a resist pattern, wet or dry etching the dielectric, and removing the resist), may alternatively be used.

The interface between the p-type grid and Al-alloyed contact preferably has low resistance, and does not degrade with environmental exposure. The interface between elemental aluminum and silver can electrochemically corrode in the presence of moisture, so other metals for the alloyed contact (e.g., tin doped with a p-type dopant) that are more stable than Al is with Ag may alternatively be used. Alternatively, a metal other than silver may be used for the grid.

As discussed above, the p-type grid that contacts the Al-alloyed contacts must be electrically isolated from the silicon surface. Most Ag pastes contain oxide frit to facilitate alloying through any surface oxides or (in some process sequences) through an antireflection coating (generally around 70 nm thick). For the purposes of this invention, this frit is preferably either very non-aggressive or eliminated entirely in order to avoid punching the p-type grid through the dielectric isolation.

A representative process for producing a back-contact cell with Al-alloyed contacts according to the present invention follows. The simplest sequence uses a single phosphorus diffusion (step 3), and produces a solar cell with a homogeneous emitter. Holes connect the front surface of the wafer to the rear surface, and are preferably formed by laser drilling, but may be formed by other processes, such as dry etching, wet etching, mechanical drilling, or water jet machining. For laser drilling, preferably a laser of sufficient power or intensity at the operating wavelength is employed such that holes can be introduced at the shortest time, such as from about 0.5 ms to about 5 ms per hole. One laser that may be employed is a Q-switched Nd:YAG laser. By the use of thinner wafers the time per hole is proportionally reduced. The diameter of the via hole may be from about 25 to 125 µm diameter, preferably from about 30 to 60 µm diameter. In one embodiment employing thin wafers, such as wafers with a thickness of 100 µm or less, the via hole diameter is approximately greater than or equal to the wafer thickness. The via hole density per surface area is dependent, in part, on the acceptable total series resistance loss due to current transport in the emitter through the holes to the rear surface. This may be determined either empirically or by theoretical calculations; by the methods of this invention the via hole density may be decreased due to decreased resistance, such as determined by $\Omega$/sq. Typically the via hole density is one hole per 1 mm$^2$ to 2 mm$^2$ surface area, but may be a lower density, such as one hole per 2 to about 4 mm$^2$.

The step of laser drilling holes in this embodiment, or in any other of the methods disclosed herein, may optionally be replaced by another method of forming vias, including but not limited to a gradient driven process such as thermomigration. Such processes are more fully disclosed in commonly owned International Application No. PCT/US2004/020370, filed Jun. 24, 2004, entitled "Back-Contacted Solar Cells with Integral Conductive Vias and Method of Making", incorporated herein by reference.

1. Laser drill holes in silicon wafer
2. Alkaline etch
3. POCl$_3$ diffusion to produce n+ diffusion on all free surfaces
4. HF etch
5. PECVD nitride on front surface
6. PECVD nitride on rear surface
7. Laser drill (ablate) (or scribe) and etch pits for the p-type contacts (optional)
8. Print Al for p-type contacts
9. Alloy Al (optionally through PECVD nitride layer)
10. Print Ag for negative conductivity type grid
11. Print Ag for positive conductivity type grid
12. Fire contacts It is not necessary to perform step 7 if the Al is adequately able to alloy through the dielectric layer in step 9. Conversely, if step 7 is performed, in step 9 the aluminum would alloy to the silicon wafer directly without having to go through the PECVD nitride layer.

The nitride deposited on the front surface in step 5, preferably silicon nitride, preferably provides passivation to the front surface and acts as an anti-reflection coating. It also preferably acts as a diffusion barrier to any subsequent diffusion, such as a heavy POCl$_3$ diffusion.

Optionally the Ag comprising the negative conductivity type grid extends into the holes as shown, thereby increasing the contact area and thus the conduction.

If a selective emitter structure is desired, the above process may be modified as follows. Step 1 is preferably deleted and the holes in the silicon wafer are laser drilled in step 7. After step 7, a heavy POCl$_3$ diffusion is performed to dope the holes, which is preferably followed by a phosphorus glass etch.

Figure 4A:
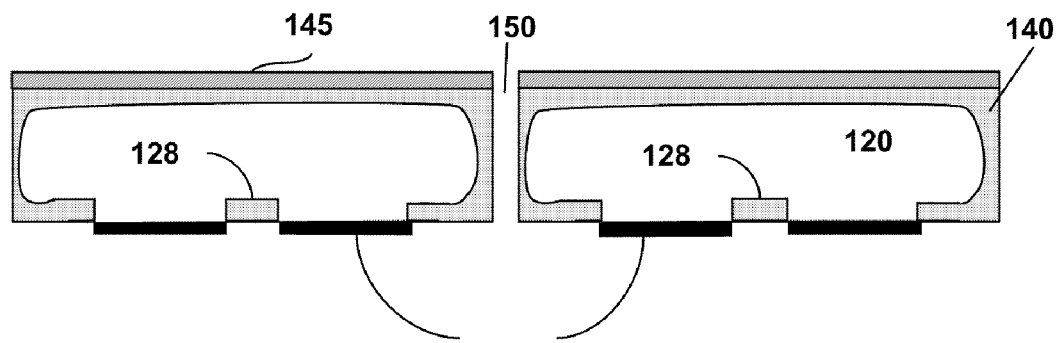
FIG. 4A is a cross-section illustrating an intermediate process step in the manufacture of one embodiment of a silicon solar cell of the invention.
Figure 4B:
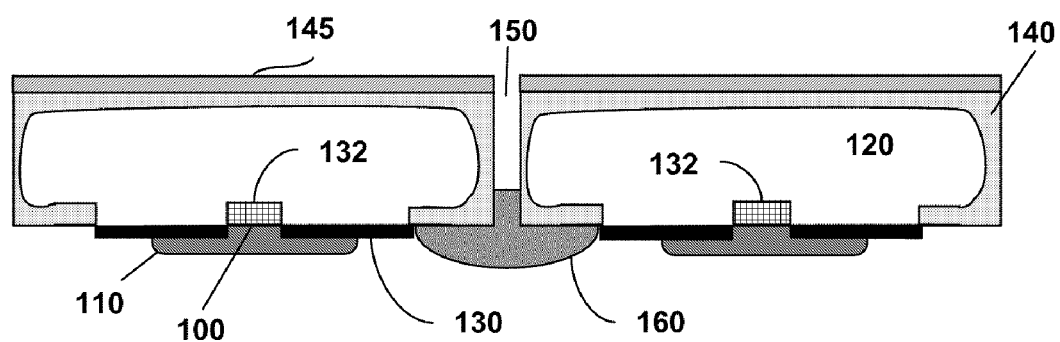
FIG. 4B is a cross-section of a silicon solar cell of the invention with Al-based metallization of p-type vias and Ag metallization of n-type vias, such as n-type vias made with EWT laser holes.

Back-Contact Solar Cell Fabrication with Al-based metallization of P-Type Vias and Ag Metallization of N-Type Vias The preferred metallizations (printed and fired Ag:Al or Al pastes) for the positive conductivity type (p-type) contact and grid may not easily fire through some rear passivation dielectric layers such as SiN. It is also desirable to have larger p-metal finger coverage of the rear (for high conductance)

than p-metal in contact with the p-semiconductor base because of high surface recombination velocity (SRV) at metal interfaces. As shown in FIG. 4B, the present method provides vias in the diffusion-barrier layer so that the area of p-metal contact 100 is less than the area of the p-metal grid coverage 110, while avoiding the need to fire the p-metal through the rear-surface passivation layer. Instead of a rear passivation layer, p-metal grid 110 is insulated from p-type substrate 120 by patterned diffusion barrier 130, which also provides surface passivation on the base. Diffusion barrier 130 preferably comprises compounds comprising one or more oxides and/or nitrides, and may optionally comprise a p-type dopant in order to provide a back surface field in the p-type areas of the rear surface. As shown in FIG. 4A, $n^+$ diffusion 140 preferably covers the entire front surface of the cell and the inside walls of holes 150, but covers only the regions of the back surface which are exposed via patterning of diffusion barrier 130. Passivation/anti-reflection layer 145 is preferably disposed on the front side of the cell. As shown in FIG. 4B, metal for n-type contact 160 on the rear surface is disposed adjacent to the $n^+$ diffusion on the rear surface in the exposed areas comprising the holes. Preferably the n-metal extends into the holes as pictured, increasing the contact area and thus the conduction. Metal for p-type contact 110 is deposited adjacent to the $n^+$ diffusion on the rear surface in remaining exposed areas 128. The present method optionally uses Al rather than Ag/Al for the p-type contact, since aluminum is desirable to form a good back surface field in the p-type region for higher efficiency and to provide higher voltages. The Al overdopes the n-type diffusion in areas 128, making it $p^+$ doped silicon 132. Unlike the prior art, cells made according to the present method have large area metallized grids 110, 160 which preferably overlap diffusion barrier 130 while contacting only small areas of the wafer (e.g. area of p-metal contact 100). The large metallization results in improved line conductivity. A non-limiting example of steps employed in the present method is set forth as follows:

1. Laser drill EWT hole pattern in Si wafer.
2. Etch to remove saw damage and laser damage.
3. Apply diffusion barrier (DB) material over rear surface areas where metallization is not desired (leaving n– and p– metallization areas open), preferably using screen printing.
4. Densify DB material (high temperature process), possibly developing thermal oxide under the DB material.
5. Diffuse phosphorous into wafer ($POCl_3$, sprayed, screen printed, or solid source diffusion).
6. Etch phosphorus glass (leaving diffusion barrier).
7. Apply SiN or other antireflection coating (AR) or passivation coating to cell front.
8. Apply Al-based metallization to p-type contact areas; i.e., those without EWT laser holes, thereby forming a $p^+$ layer in place of the existing $n^+$ diffusion. Frit content should be chosen as to not dissolve DB material so that metallization may extend beyond the contact areas.
9. Apply Ag-based metallization to n-type areas; i.e., those with EWT laser holes. Preferably the metallization does not overlap the DB, as shown in FIG. 4B; however, the n-type metallization may optionally extend beyond the contact area and overlap the DB, similar to the p-type metallization. In that case, frit content should preferably be chosen as to not dissolve DB material.
10. Cofire contacts.

For cells made according to this method, the benefit of the surface passivation achieved on the rear side at the p-type wafer/DB material interface and the trend towards higher lifetime in commercial solar Si wafers must outweigh the loss of $n^+$ emitter coverage on the rear of the cell.

Optionally a passivation layer, comprising for example an oxide or nitride such as $SiO_2$ or SiN, may be disposed on the rear surface, preferably under the DB.

In certain variants of the foregoing method, rather than comprising solely a p-type dopant, the p-metal may optionally comprise Ag with added Al or another p-type dopant. In one such variant the $n^+$ region underneath the p-type contact is successfully over-doped; that is, a spiking contact through the $n^+$ region is made with the p-type substrate. In another variant, the Ag-dopant metal is fired at a temperature above the Ag—Si eutectic temperature so that the contact is alloyed with the silicon.

Figure 5A:
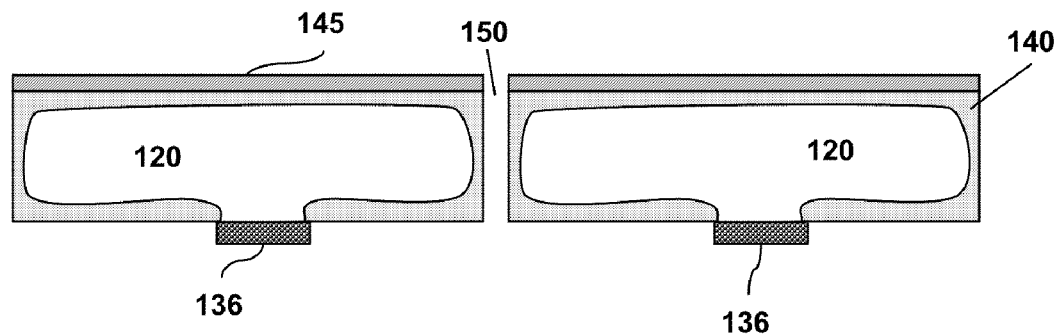
FIG. 5A is a cross-section illustrating an intermediate process step in the manufacture of another embodiment of a silicon solar cell of the invention.
Figure 5B:
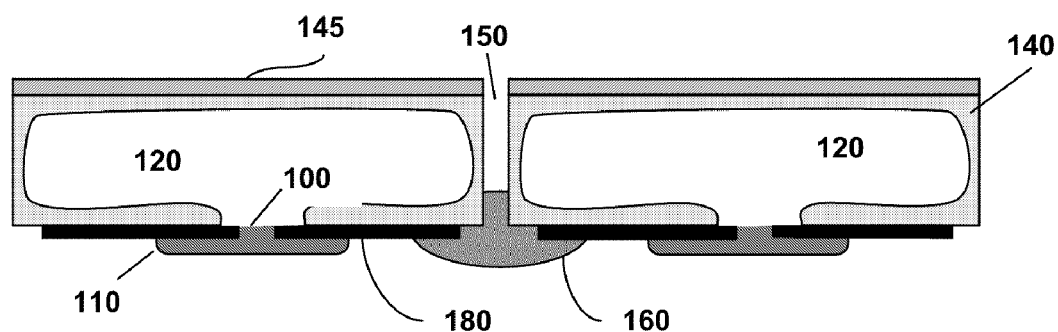
FIG. 5B is a cross-section of a silicon solar cell of the invention utilizing increased emitter coverage area on the backside by use of a dedicated metallization barrier.

Back-Contact Solar Cell Fabrication with Al-Based Metallization of P-Type Vias and Ag Metallization of N-Type Vias with Increased Emitter Coverage Area This method is similar to the previous method, but has the advantage of greater $n^+$ emitter coverage on the rear of cell. In this method the emitter coverage area on the backside is increased by use of a dedicated diffusion barrier (DB) 136, as shown in FIG. 5A, which is deposited on the rear surface where the p-type contact will touch the wafer surface in order to block the $n^+$ diffusion, thereby obtaining a narrow p-type channel on the surface. Diffusion barrier 136 is subsequently removed. As shown in FIG. 5B, this design also benefits from metallization barrier (MB) 180 which is preferably optimized for surface passivation and for achieving narrow vias to the semiconductor. The MB preferably comprises a transition metal oxide or other dielectric material and is preferably applied with a low-cost method such as screen printing. The MB permits the use of larger p-type and n-type grids for improved conductivity, while reducing the n-type and p-type metallization areas contacting wafer 120, which significantly improves efficiency by reducing net surface recombination velocity of the surfaces.

A non-limiting example of steps employed in the present method is set forth as follows:

1. Laser drill EWT hole pattern in Si wafer.
2. Saw damage and laser damage etch.
3. Apply DB material in narrow channels or areas to prevent n-type diffusion to the p-base, preferably using screen printing.
4. Densify DB material, possibly developing a thermal oxide under the DB material.
5. Diffuse phosphorous into wafer ($POCl_3$, sprayed, screen printed, or solid source diffusion).
6. Etch phosphorus glass and diffusion barrier.
7. Apply MB.
8. Densify and oxidize MB, possibly developing a thermal oxide under the MB material.
9. Apply SiN or other AR or passivation coating to cell front surface (and optionally to the rear surface—not shown in figure).
10. Apply p-metallization to p-type contact areas; i.e., those areas of exposed wafer without EWT laser holes. Frit content should be chosen as to not dissolve MB material so that metallization may extend beyond vias.
11. Apply n– metallization to n-type contact areas; i.e., those areas of exposed wafer which comprise EWT laser holes. Frit content should be chosen as to not dissolve MB material so that metallization may extend beyond vias.
12. Co-fire contacts.

While this method adds another screen printing and firing step for the MB, in general such steps are comparatively inexpensive.

As with all of the methods of the present invention, a passivating layer (preferably comprising an oxide or nitride)

may be grown or deposited on the back surface for improved back surface passivation, or for easier DB material etching or lift off.

Minimizing the Series Resistance in an Interdigitated Back Contact Grid Pattern

Because back-contact silicon solar cells have both the negative-polarity and positive-polarity contacts and current-collection grids on the back surface, the negative-polarity and positive-polarity grids must be electrically isolated from one another. The grids must also collect the current to bonding pads or busbars. Metallic ribbons are typically attached to the bonding pads or busbars in order to connect the solar cells into an electrical circuit.

Figure 6A:
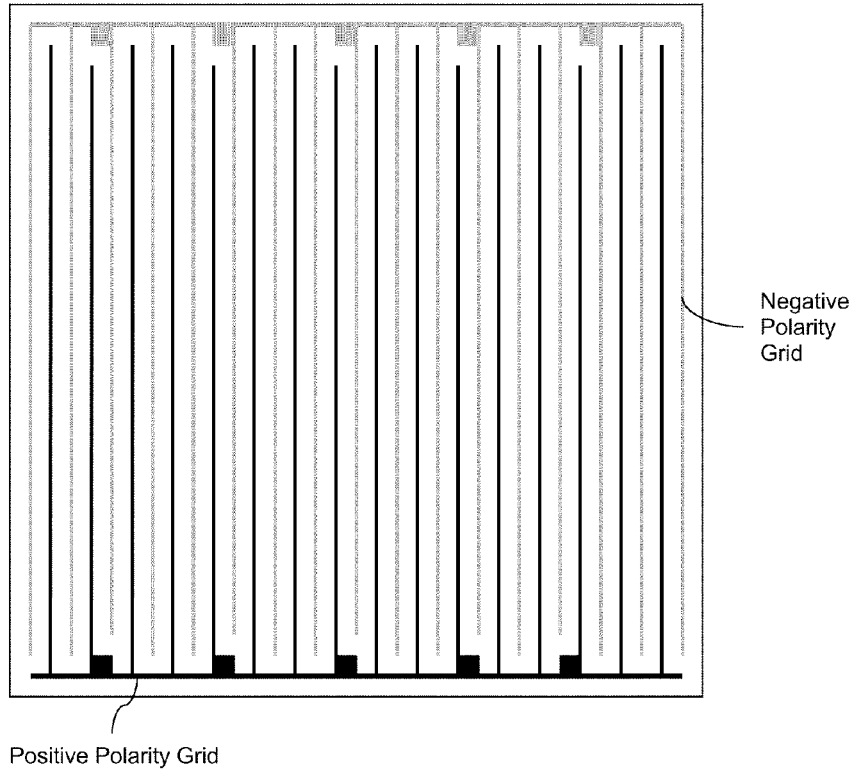
FIG. 6A is a plan view of a back-contact solar cell with interdigitated grid pattern. Grids with different shadings correspond to negative and positive conductivity type grids. Bond pads are provided on edge of cell for interconnection of solar cells into an electrical circuit. Illustration is not to scale; typically there is a much higher density of grid lines than is illustrated.
Figure 6B:
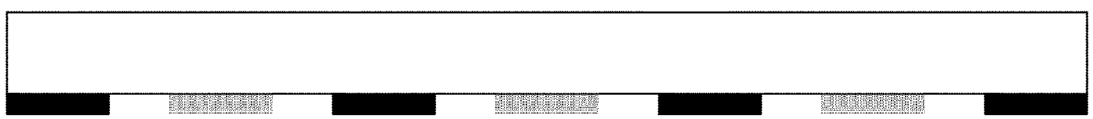
FIG. 6B is a cross-sectional view of the interdigitated grids in an IBC cell of FIG. 6A.
Figure 7:
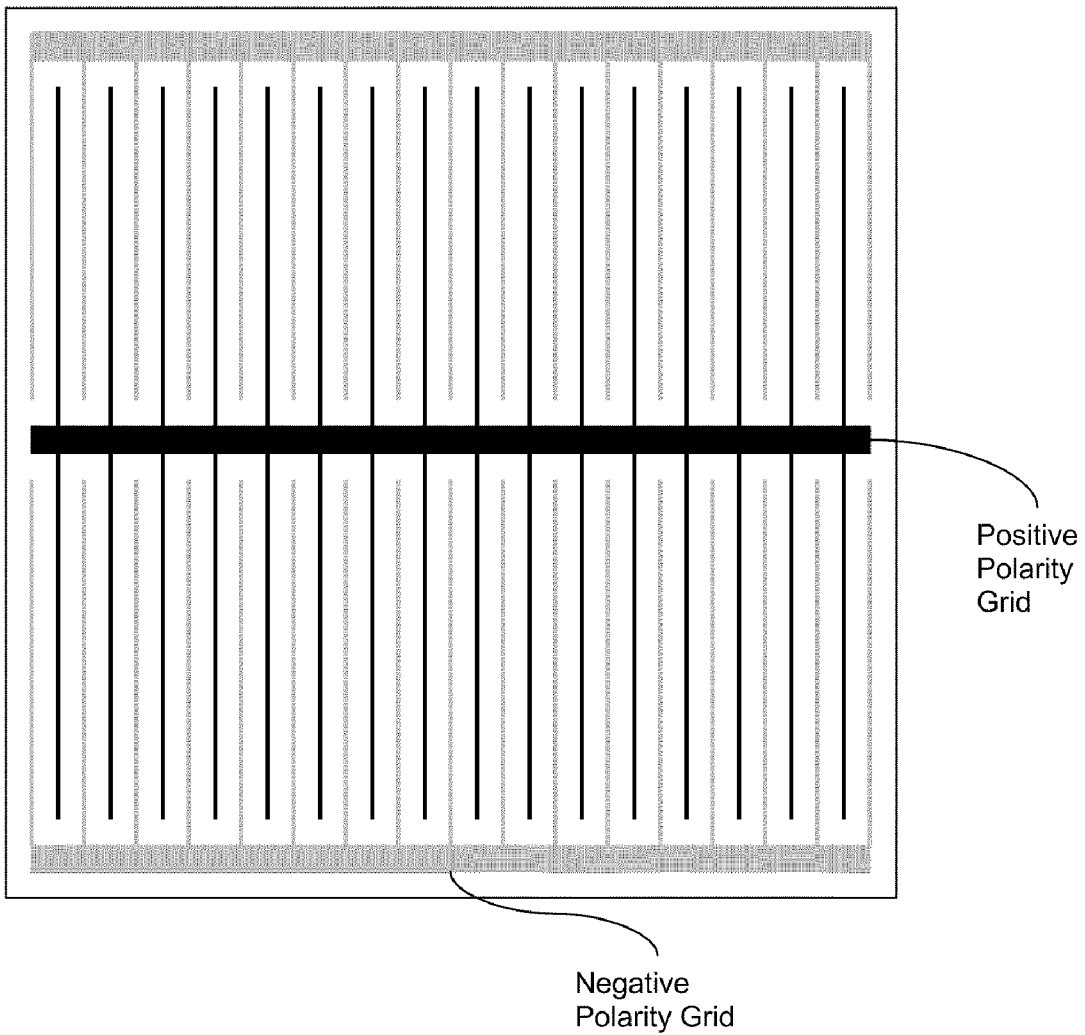
FIG. 7 is a plan view of a back-contact solar cell IBC grid pattern with busbars at the edge and in the center of the cell.

There are two geometries for the grids in a back-contact cell. In an "interdigitated back contact" (IBC) geometry, the negative- and positive-conductivity type grids form interdigitated comb-like structures (FIGS. 6A and 6B). This structure is simple to implement in production, but suffers from high series resistance due to the long grid lines with limited cross sectional area. The length of the grid lines, and therefore the series resistance, can be reduced by including one or more busbars (FIG. 7). However, the busbars reduce the effective active area because photocurrent collection is reduced in region above the busbar. Also, the geometry for interconnecting adjacent back-contact solar cells becomes more complex for cells with busbars in the center of the cell rather than bonding pads at the edge of the cell. IBC patterns can be easily produced using low-cost production techniques like screen printing.

Figure 8:
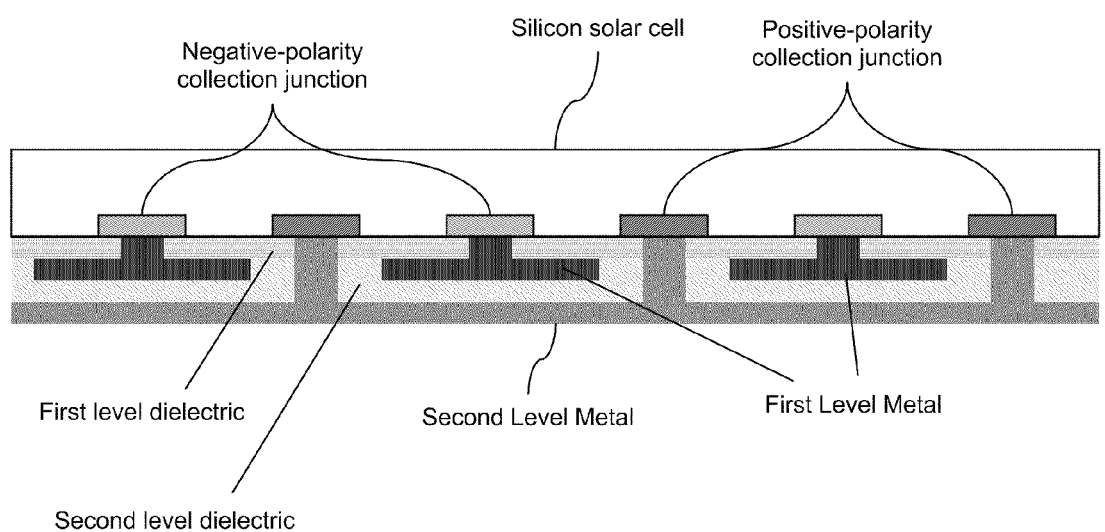
FIG. 8 is cross sectional view of multilevel metallization for a back-contact solar cell.

The second geometry for the grids in a back-contact cell uses a multilevel metallization (FIG. 8) (Richard M. Swanson, "Thermophotovoltaic converter and cell for use therein," U.S. Pat. No. 4,234,352, issued Nov. 18, 1980). The metal levels are stacked vertically with deposited dielectric layers providing electrical isolation. Multilevel metallization geometry can achieve a lower series resistance than the IBC geometry because metal covers the entire rear surface. However, this structure requires two dielectric depositions ("first" and "second" level) and patterning steps in addition to the metallization steps. In addition, multilevel metallizations require very costly thin-film processing techniques in order to avoid pinhole defects in the dielectric isolation layer that could lead to electrical shunts.

The present invention provides two embodiments for minimizing the series resistance of the preferred IBC grid pattern (with the bonding pads at the edge of the cell) in an interdigitated back contact grid pattern of a back-contact silicon solar cell.

Figure 9:
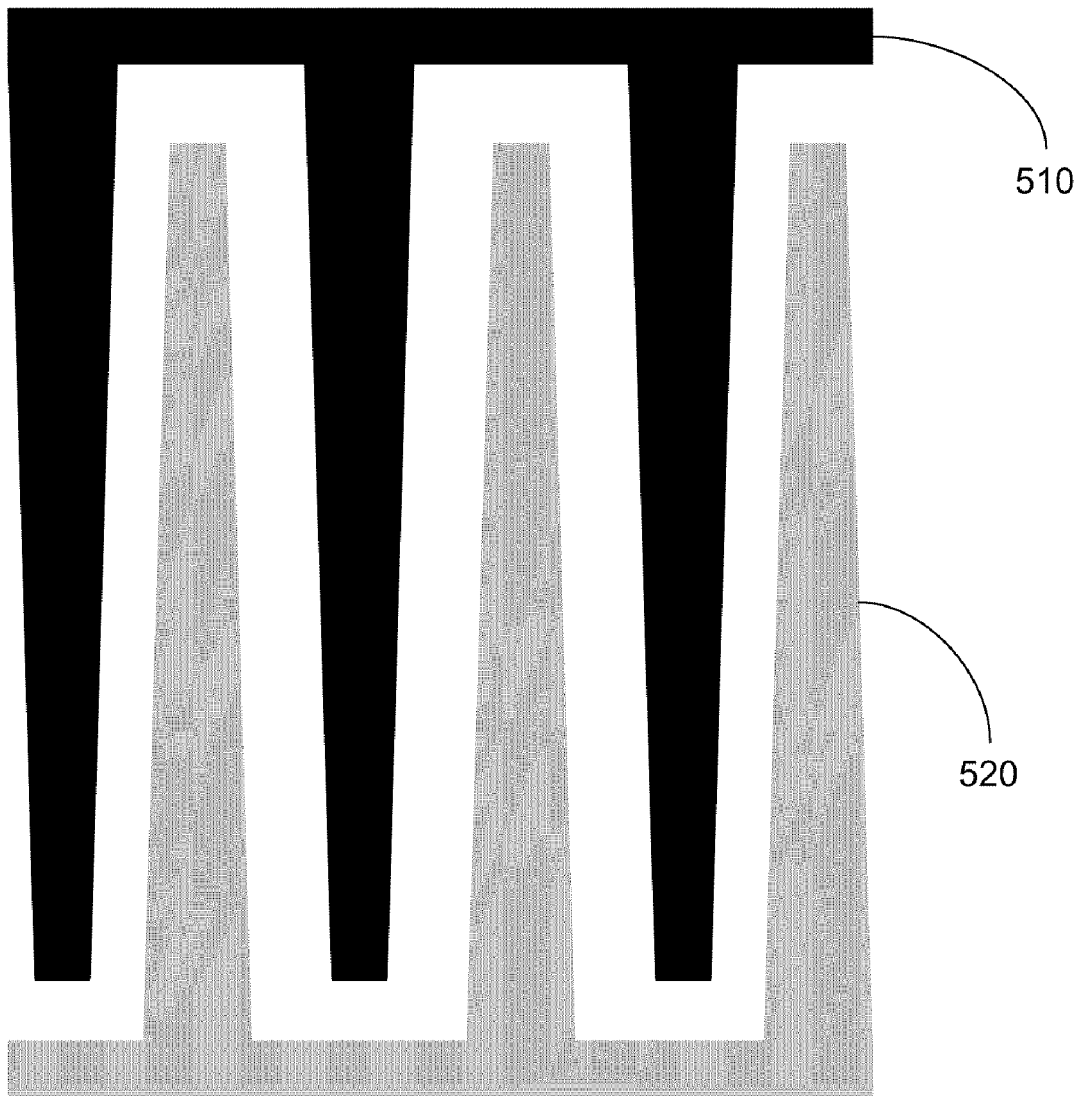
FIG. 9 is a plan view of a back-contact solar cell IBC grid pattern of this invention.
Figure 10:
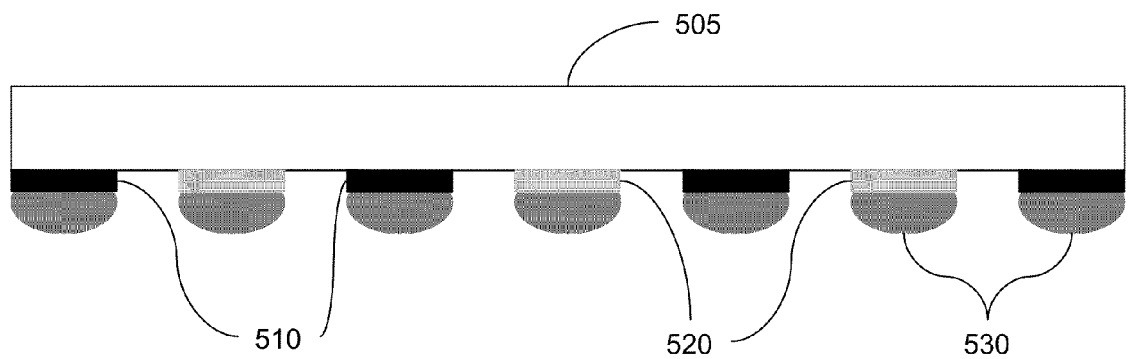
FIG. 10 is a cross-sectional view of back-contact solar cell IBC grid with plated metallization.
Figure 1:
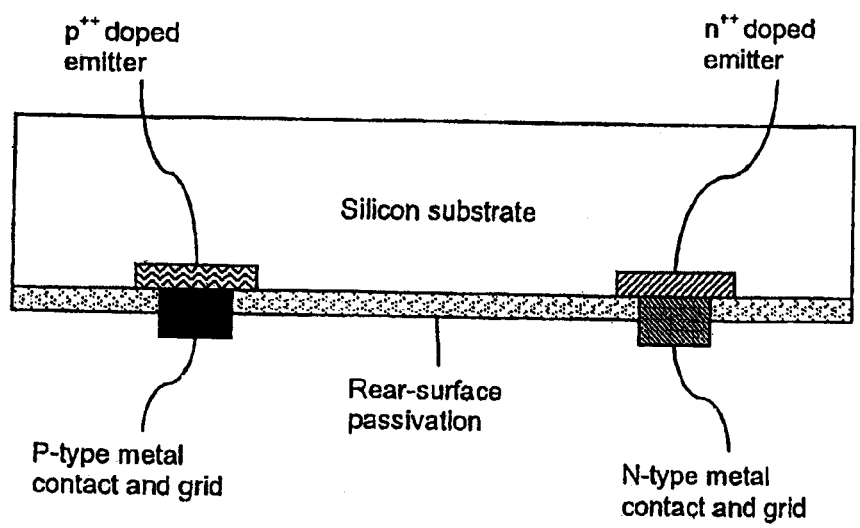

In a first embodiment, the grid lines are made with a tapered width—such that the width is increased along the direction of current flow until it reaches the edge of the cell. This reduces the series resistance at a constant grid coverage fraction because the cross-sectional area of the grid increases at the same rate that the current carried by the grid increases. A preferred embodiment of the tapered width pattern in both positive-polarity current-collection grid 510 and negative-polarity current-collection grid 520 is shown in FIG. 9 (not to scale). FIG. 10 shows a cross-sectional view of the IBC grids of FIG. 15 on the back surface of solar cell 505 with plated metallization; that is, metal 530 plated over the contact metallizations.

In general, the degree of tapering may be determined either empirically or by calculation, to determine an optimal tapering. Additionally, the metal coverage fraction and the spacing between same-polarity grids may similarly be varied. In a simulation of an IBC cell with typical properties, the series resistance of an IBC grid was calculated for a 125-mm by 125-mm cell. The spacing between same-polarity grids was selected to be 2 mm, and the metal coverage fraction was selected to be 40%. The grid lines had a width of 400 µm for the constant-width IBC geometry, while the grid lines increased from 200 to 600 µm for the tapered geometry. The series resistance was 36% less for the tapered versus the constant-width IBC geometry. Note that other tapers may be used as required; for example, the grid line might taper from 250 to 550 µm width.

In a second embodiment, the grid resistance can be reduced by making the grid lines thicker. The thickness of screen-printed Ag paste grids is limited by the physical properties of the paste and screen. The preferred geometry for the IBC grid permitting edge collection (FIG. 6A) typically requires relatively thick grid lines (>50 µm) in order to be able to conduct current over the large dimensions with acceptable resistance losses. This is thicker than can be easily screen printed. Two preferred methods of increasing the grid line thickness of the printed Ag IBC grid are: by dipping the IBC cell into molten solder ("tin dipping") or by plating (electro- or electroless) of metal onto the grid lines. Tin dipping is a well known process that is used by some silicon solar cell manufacturers for fabrication of conventional silicon solar cells. The temperature of the molten solder depends upon the composition of the solder, but is generally less than 250° C. In one embodiment a Sn:Ag solder is employed in order to minimize dissolution of the printed Ag grid line.

Alternatively, many metals can be plated via electro- or electroless plating. Cu and Ag are particularly advantageous in that both metals can be readily soldered to and have excellent electrical conductivity. Another advantage of plated grid lines is reduced stress in the completed cell. A thin printed Ag line may preferably be used since the final conductivity will be determined by the subsequent metal buildup step. Ag is fired at a high temperature (generally above 700° C.), so keeping this layer thin reduces stress from the high firing temperature. In addition, plating is generally performed at low temperatures (<100° C.). The grid thickness thus can be increased at a lower temperature, thereby introducing less stress to the completed cell.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all references, applications, patents, and publications cited above, and of the corresponding applications, are hereby incorporated by reference.

What is claimed is:

1. A method of making a back-contact solar cell, the method comprising the steps of:

forming a plurality of holes extending from a front surface of a semiconductor substrate to a rear surface of the substrate, the substrate comprising having a first conductivity type;

depositing a patterned diffusion barrier on the rear surface;

forming a diffusion zone on the front surface, regions of the rear surface not covered by the diffusion barrier, and on surfaces enclosing the holes, wherein the diffusion zone has a second conductivity type opposite to that of the first conductivity type;

disposing a first conductive grid on the diffusion barrier in electrical contact with the substrate in a subset of the regions of the rear surface not covered by the diffusion barrier; and disposing a second conductive grid on the rear surface in electrical contact with the diffusion zone.

2. The method of claim 1 further comprising the step of changing the conductivity type of the subset of the regions substantially to the first conductivity type.

3. The method of claim 1 wherein the depositing step comprises using screen printing.

4. The method of claim 1 wherein the first conductive grid comprises aluminum.

5. The method of claim 1 wherein material comprising the second conductive grid at least partially fills the holes.

6. The method of claim 1 wherein a width of a grid line of the first conductive grid is wider than a width of one of the regions.

7. The method of claim 1 wherein the first conductive grid is interdigitated with the second conductive grid.

8. The method of claim 1 wherein at least one of the first conductive grid or the second conductive grid comprise grid lines having a tapered width.

\* \* \* \* \*

UNITED STATES PATENT AND TRADEMARK OFFICE
CERTIFICATE OF CORRECTION

PATENT NO. : 7,863,084 B2  
APPLICATION NO. : 12/553803  
DATED : January 4, 2011  
INVENTOR(S) : Hacke et al.

Page 1 of 2

Figure 1:
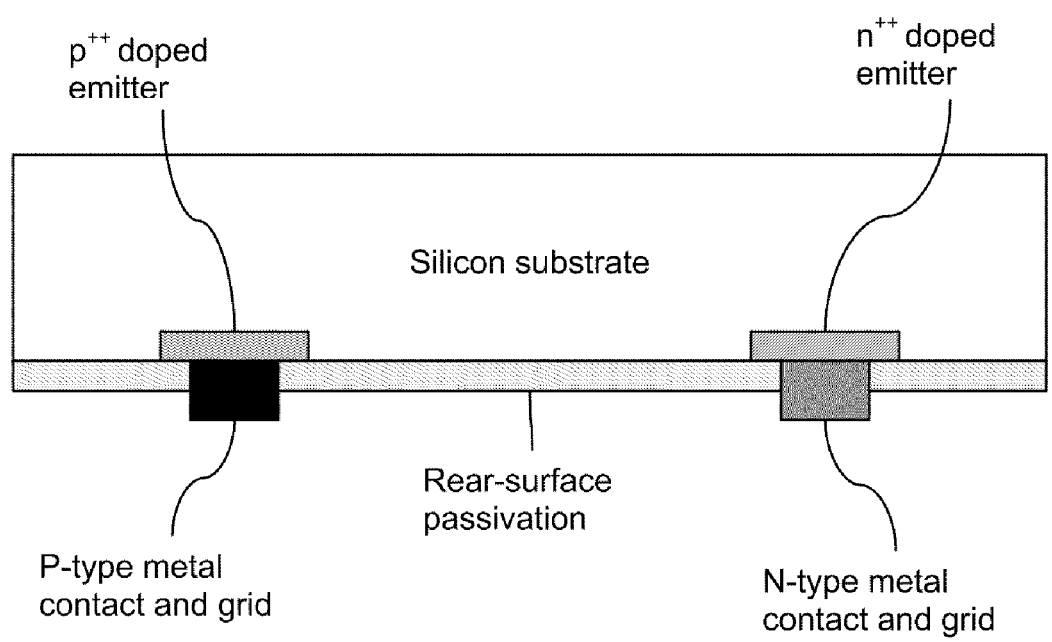
FIG. 1 is an illustration of a generic back-contact solar cell, highlighting only features on the back surface.

It is certified that error appears in the above-identified patent and that said Letters Patent is hereby corrected as shown below:

The sheet of drawing consisting of figure 1, should be deleted to appear as per attached figure 1.

Column 1, Line 22, please delete "entitle-Id";

Column 7, Line 20, please delete "11/050785" and insert --11/050185-- therefor;

Column 12, Claim 1, Line 56, please delete "comprising".

Signed and Sealed this
Twelfth Day of April, 2011

David J. Kappos
*Director of the United States Patent and Trademark Office*